(12) United States Patent
Smith et al.

(10) Patent No.: US 10,361,103 B2
(45) Date of Patent: Jul. 23, 2019

(54) HIGH DEFINITION HEATER SYSTEM HAVING A FLUID MEDIUM

(71) Applicant: WATLOW ELECTRIC MANUFACTURING COMPANY, St. Louis, MO (US)

(72) Inventors: Kevin R. Smith, Columbia, MO (US); Kevin Ptasienski, O'Fallon, MO (US); Ray Alan Derler, Ballwin, MO (US); Cal T. Swanson, St. Louis, MO (US); Philip S. Schmidt, Winona, MN (US); Mohammad Nosrati, Redwood City, CA (US); Jacob R. Lindley, St. Louis, MO (US); Allen N. Boldt, Kirkwood, MO (US); Sanhong Zhang, Ballwin, MO (US); Louis P. Steinhauser, St. Louis, MO (US); Dennis S. Grimard, Ann Arbor, MI (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 135 days.

(21) Appl. No.: 15/377,110

(22) Filed: Dec. 13, 2016

(65) Prior Publication Data
US 2017/0092514 A1   Mar. 30, 2017

Related U.S. Application Data

(62) Division of application No. 13/599,692, filed on Aug. 30, 2012, now Pat. No. 9,553,006.
(Continued)

(51) Int. Cl.
*H01L 21/00* (2006.01)
*H01L 21/67* (2006.01)
(Continued)

(52) U.S. Cl.
CPC .. *H01L 21/67103* (2013.01); *H01L 21/67098* (2013.01); *H01L 21/67109* (2013.01);
(Continued)

(58) Field of Classification Search
CPC ......... H01L 21/67103; H01L 21/67098; H01L 21/67109; H01L 21/67248; H01L 21/6833;
(Continued)

(56) References Cited

U.S. PATENT DOCUMENTS 3,752,956 A   8/1973   Cahill et al.
5,802,856 A   9/1998   Schaper et al.
(Continued)

FOREIGN PATENT DOCUMENTS

CN   2634776   8/2004
CN   101001975   7/2007
(Continued)

OTHER PUBLICATIONS

International Search Report for International Application PCT/US2012/053049, dated Dec. 6, 2012.
(Continued)

*Primary Examiner* — Travis C Ruby
(74) *Attorney, Agent, or Firm* — Burris Law, PLLC

(57) ABSTRACT

A thermal system includes: a base member including at least one fluid passageway in which a two-phase fluid is disposed; a tuning layer secured to the base member; and a control system. The pressure of the two-phase fluid is controlled such that the two-phase fluid provides at least one of heating and cooling to the base member. The tuning layer includes a plurality of zones. The control system includes a plurality of sets of power lines in communication with the tuning layer, and a plurality of addressable control elements in electrical communication with the power lines and with the
(Continued)

tuning layer. The control elements provide selective control of the tuning layer zones.

18 Claims, 15 Drawing Sheets

Related U.S. Application Data

(60) Provisional application No. 61/528,939, filed on Aug. 30, 2011, provisional application No. 61/635,310, filed on Apr. 19, 2012.

(51) Int. Cl.

| | | |
|---|---|---|
| *H05B 3/20* | (2006.01) | |
| *H05B 1/02* | (2006.01) | |
| *H05B 1/00* | (2006.01) | |
| *H05B 3/02* | (2006.01) | |
| *H01L 21/683* | (2006.01) | |
| *H05B 3/06* | (2006.01) | |

(52) U.S. Cl.
CPC .... *H01L 21/67248* (2013.01); *H01L 21/6833* (2013.01); *H05B 1/00* (2013.01); *H05B 1/02* (2013.01); *H05B 1/0202* (2013.01); *H05B 1/0227* (2013.01); *H05B 1/0233* (2013.01); *H05B 3/02* (2013.01); *H05B 3/06* (2013.01); *H05B 3/20* (2013.01); *H05B 2203/005* (2013.01); *H05B 2203/013* (2013.01); *H05B 2213/03* (2013.01); *Y10T 156/10* (2015.01)

(58) Field of Classification Search
CPC ..... H01L 23/34; H01L 23/473; H01L 23/427; H05B 1/00; H05B 1/02; H05B 1/0202; H05B 1/0227; H05B 1/0233; H05B 3/02; H05B 3/06; H05B 3/16; H05B 3/20; H05B 3/68; H05B 2203/005; H05B 2203/013; H05B 2213/03; H05B 6/062; H01C 17/00; G06F 1/20; C23C 16/463
See application file for complete search history.

(56) References Cited

U.S. PATENT DOCUMENTS

| | | | |
|---|---|---|---|
| 6,392,205 B1 | 5/2002 | Minonishi | |
| 6,508,062 B2 * | 1/2003 | Flanigan | F25B 21/04 |
| | | | 62/259.2 |
| 2003/0066826 A1 | 4/2003 | Lee et al. | |
| 2004/0232136 A1 | 11/2004 | Hisaii | |
| 2005/0145617 A1 | 7/2005 | McMillin et al. | |
| 2006/0144516 A1 | 6/2006 | Ricci et al. | |
| 2006/0289447 A1 | 12/2006 | Mohamed | |
| 2008/0011737 A1 | 1/2008 | Fukuoka | |
| 2009/0059461 A1 | 3/2009 | Yonekura et al. | |
| 2011/0000426 A1 | 1/2011 | Herchen | |
| 2011/0092072 A1 | 4/2011 | Singh et al. | |

FOREIGN PATENT DOCUMENTS

| | | |
|---|---|---|
| CN | 100556217 | 10/2009 |
| CN | 101778948 | 7/2010 |
| EP | 1303168 | 12/2001 |
| EP | 2203028 | 11/2009 |
| JP | H1010072 | 1/1998 |
| JP | H10116887 | 5/1998 |
| JP | 2001126851 | 5/2001 |
| JP | 2003258065 | 9/2003 |
| JP | 3713220 | 11/2005 |
| JP | 2005347612 | 12/2005 |
| JP | 2007059694 | 3/2007 |
| JP | 2008085283 | 4/2008 |
| JP | 2008527694 | 7/2008 |
| JP | 2008294146 | 12/2008 |
| JP | 2009054932 | 3/2009 |
| JP | 2010040644 | 2/2010 |
| JP | 2010129766 | 6/2010 |
| JP | 4505169 | 7/2010 |
| WO | 2010061740 | 6/2012 |

OTHER PUBLICATIONS

International Search Report for International Application PCT/US2012/053054, dated Dec. 6, 2012.
International Search Report for International Application PCT/US2012/053058, dated Dec. 6, 2012.
International Search Report for International Application PCT/US2012/053067, dated Dec. 6, 2012.
International Search Report for International Application PCT/US2012/053069 dated Dec. 6, 2012.
International Search Report for International Application PCT/US2012/053148, dated Jan. 15, 2013.
ISRWO of PCT/US2012/053137 dated Dec. 7, 2012.
ISR of PCT/US2012/053117 dated Dec. 7, 2012.
ISR of PCT/US2012/053049 dated Nov. 28, 2012.
ISR of PCT/US2012/053054 dated Nov. 27, 2012.
ISRWO of PCT/US2012/053148 dated Jan. 8, 2013.
ISRWO of PCT/US2012/053058 dated Nov. 28, 2012.
ISRWO of PCT/US2012/053069 dated Nov. 27, 2012.
ISRWO of PCT/US2012/053067 dated Nov. 27, 2012.

\* cited by examiner

HIGH DEFINITION HEATER SYSTEM HAVING A FLUID MEDIUM

CROSS-REFERENCE TO RELATED APPLICATIONS

This application is a divisional application of U.S. Ser. No. 13/599,692, which claims the benefit of provisional application Ser. Nos. 61/528,939 filed on Aug. 30, 2011 and 61/635,310 filed on Apr. 19, 2012, the contents of which are incorporated herein by reference in their entirety.

FIELD

The present disclosure relates to heater systems, and in particular, heater systems that can deliver a precise temperature profile to a heating target during operation in order to compensate for heat loss and/or other variations, in such applications as chucks or susceptors for use in semiconductor processing.

BACKGROUND

The statements in this section merely provide background information related to the present disclosure and may not constitute prior art.

In the art of semiconductor processing, for example, a chuck or susceptor is used to hold a substrate (or wafer) and to provide a uniform temperature profile to the substrate during processing. Referring to FIG. 1, a support assembly 10 for an electrostatic chuck is illustrated, which includes the electrostatic chuck 12 with an embedded electrode 14, and a heater plate 16 that is bonded to the electrostatic chuck 12 through an adhesive layer 18, which is typically a silicone adhesive. A heater 20 is secured to the heater plate 16, which may be an etched-foil heater, by way of example. This heater assembly is bonded to a cooling plate 22, again through an adhesive layer 24 that is typically a silicone adhesive. The substrate 26 is disposed on the electrostatic chuck 12, and the electrode 14 is connected to a voltage source (not shown) such that electrostatic power is generated, which holds the substrate 26 in place. A radio frequency (RF) or microwave power source (not shown) may be coupled to the electrostatic chuck 12 within a plasma reactor chamber that surrounds the support assembly 10. The heater 20 thus provides requisite heat to maintain temperature on the substrate 26 during various in-chamber plasma semiconductor processing steps, including plasma-enhanced film deposition or etch.

During all phases of processing of the substrate 26, it is important that the temperature profile of the electrostatic chuck 12 be tightly controlled in order to reduce processing variations within the substrate 26 being etched, while reducing total processing time. Improved devices and methods for improving temperature uniformity on the substrate are continually desired in the art of semiconductor processing, among other applications.

SUMMARY

In one form of the present disclosure, a thermal system is provided that includes: a base member including at least one fluid passageway in which a two-phase fluid is disposed; a tuning layer secured to the base member; and a control system. The pressure of the two-phase fluid is controlled such that the two-phase fluid provides at least one of heating and cooling to the base member. The tuning layer includes a plurality of zones. The control system includes a plurality of sets of power lines in communication with the tuning layer, and a plurality of addressable control elements in electrical communication with the power lines and with the tuning layer. The control elements provide selective control of the tuning layer zones.

In another form, a thermal system is provided that includes: a base member including at least one fluid passageway in which a two-phase fluid is disposed; a tuning layer secured to the base member and including a plurality of zones; and a control system. The pressure of the two-phase fluid is controlled such that the two-phase fluid provides at least one of heating and cooling to the base member. The thermal system further includes an upper member disposed proximate the tuning layer, and a lower member adjacent the upper member. The upper member defines a plurality of tapered cavities aligned with each of the zones, and includes a plurality of power vias. The lower member defines a plurality of reverse tapered cavities aligned with the tapered cavities of the upper member, and includes a plurality of power vias in communication with the power vias of the upper member. The control system includes a plurality of sets of power lines in communication with the tuning layer, and a plurality of addressable control elements in electrical communication with the power lines and with the tuning layer. The control elements provide selective control of the zones of the tuning layer.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. For example, the following forms of the present disclosure are directed to chucks for use in semiconductor processing, and in some instances, electrostatic chucks. However, it should be understood that the heaters and systems provided herein may be employed in a variety of applications and are not limited to semiconductor processing applications.

Figure 2:
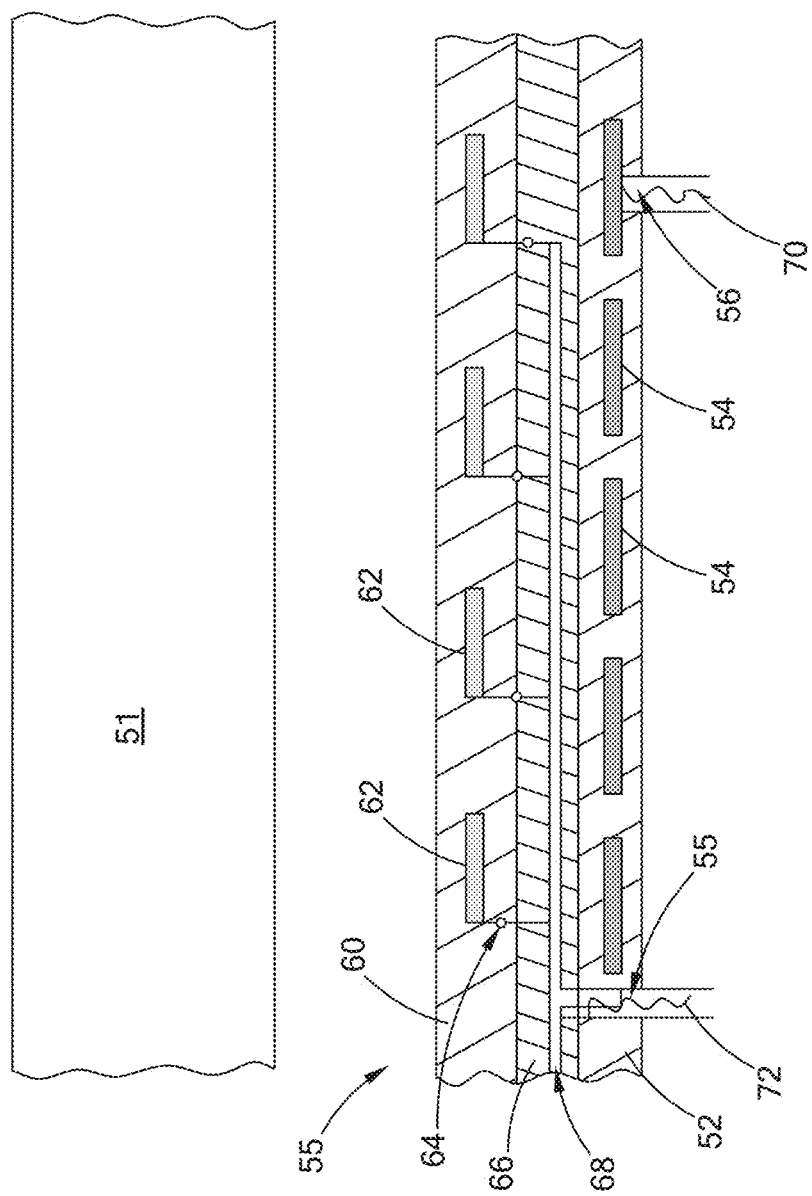
FIG. 2 is a partial side view of a heater having a tuning layer and constructed in accordance with the principles of one form of the present disclosure.

Referring to FIG. 2, one form of the present disclosure is a heater 50 that includes a base heater layer 52 having at least one heater circuit 54 embedded therein. The base heater layer 52 has at least one aperture 56 (or via) formed therethrough for connecting the heater circuit 54 to a power supply (not shown). The base heater layer 52 provides primary heating while a tuning heater layer 60 disposed proximate the heater layer 52 as shown provides for fine tuning of a heat distribution provided by the heater 50. The tuning layer 60 includes a plurality of individual heating elements 62 embedded therein, which are independently controlled. At least one aperture 64 is formed through the tuning layer 60 for connecting the plurality of individual heating elements 62 to the power supply and controller (not shown). As further shown, a routing layer 66 is disposed between the base heater layer 52 and the tuning layer 60 and defines an internal cavity 68. A first set of electrical leads 70 connects the heater circuit 54 to the power supply, which extend through the heater layer aperture 56. A second set of electrical leads 72 connects a plurality of heating elements 62 to the power supply and extend through the internal cavity 68 of the routing layer 66, in addition to the aperture 55 in the base heater layer 52. It should be understood that the routing layer 66 is optional, and the heater 50 could be employed without the routing layer 66 and instead having only the base heater layer 52 and the tuning heater layer 60.

In another form, rather than providing fine tuning of a heat distribution, the tuning layer 60 may alternately be used to measure temperature in the chuck 12. This form provides for a plurality of area-specific or discreet locations, of temperature dependent resistance circuits. Each of these temperature sensors can be individually read via a multiplexing switching arrangement, exemplary forms of which are set forth in greater detail below that allows substantially more sensors to be used relative to the number of signal wires required to measure each individual sensor. The temperature sensing feedback can provide necessary information for control decisions, for instance, to control a specific zone of backside cooling gas pressure to regulate heat flux from the substrate 26 to the chuck 12. This same feedback can also be used to replace or augment temperature sensors installed near the base heater 50 for temperature control of base heating zones 54 or balancing plate cooling fluid temperature (not shown) via ancillary cool fluid heat exchangers.

In one form, the base heater layer 50 and the tuning heater layer 60 are formed from enclosing heater circuit 54 and tuning layer heating elements 62 in a polyimide material for medium temperature applications, which are generally below 250° C. Further, the polyimide material may be doped with materials in order to increase thermal conductivity.

In other forms, the base heater layer 50 and/or the tuning heater layer 60 are formed by a layered process, wherein the layer is formed through application or accumulation of a material to a substrate or another layer using processes associated with thick film, thin film, thermal spraying, or sol-gel, among others.

In one form, the base heating circuit 54 is formed from Inconel® and the tuning layer heating elements 62 are a Nickel material. In still another form, the tuning layer heating elements 62 are formed of a material having sufficient temperature coefficient of resistance such that the elements function as both heaters and temperature sensors, commonly referred to as "two-wire control." Such heaters and their materials are disclosed in U.S. Pat. No. 7,196,295 and pending U.S. patent application Ser. No. 11/475,534, which are commonly assigned with the present application and the disclosures of which are incorporated herein by reference in their entirety.

With the two-wire control, various forms of the present disclosure include temperature, power, and/or thermal impedance based control over the layer heating elements 62 through knowledge or measurement of voltage and/or current applied to each of the individual elements in the thermal impedance tuning layer 60, converted to electrical power and resistance through multiplication and division, corresponding in the first instance, identically to the heat flux output from each of these elements and in the second, a known relationship to the element temperature. Together these can be used to calculate and monitor the thermal impedance load on each element to allow an operator or control system to detect and compensate for area-specific thermal changes that may result from, but are not limited to, physical changes in the chamber or chuck due to use or maintenance, processing errors, and equipment degradation. Alternatively, each of the individually controlled heating elements in the thermal impedance tuning layer 60 can be assigned a setpoint resistance corresponding to the same or different specific temperatures which then modify or gate the heat flux originating from corresponding areas on a substrate through to the base heater layer 52 to control the substrate temperature during semiconductor processing.

In one form, the base heater 50 is bonded to a chuck 51, for example, by using a silicone adhesive or even a pressure sensitive adhesive. Therefore, the heater layer 52 provides primary heating, and the tuning layer 60 fine tunes, or adjusts, the heating profile such that a uniform or desired temperature profile is provided to the chuck 51, and thus the substrate (not shown).

In another form of the present disclosure, the coefficient of thermal expansion (CTE) of the tuning layer heating elements 62 is matched to the CTE of the tuning heating layer substrate 60 in order to improve thermal sensitivity of the tuning layer heating elements 62 when exposed to strain loads. Many suitable materials for two-wire control exhibit similar characteristics to Resistor Temperature Devices (RTDs), including resistance sensitivity to both temperature and strain. Matching the CTE of the tuning layer heating elements 62 to the tuning heater layer substrate 60 reduces strain on the actual heating element. And as the operating temperatures increase, strain levels tend to increase, and thus CTE matching becomes more of a factor. In one form, the tuning layer heating elements 62 are a high purity Nickel-Iron alloy having a CTE of approximately 15 ppm/° C., and the polyimide material that encloses it has a CTE of approximately 16 ppm/° C. In this form, materials that bond the tuning heater layer 60 to the other layers exhibit elastic characteristics that physically decouple the tuning heater layer 60 from other members of the chuck 12. It should be understood that other materials with comparable CTEs may also be employed while remaining within the scope of the present disclosure.

Figure 3:
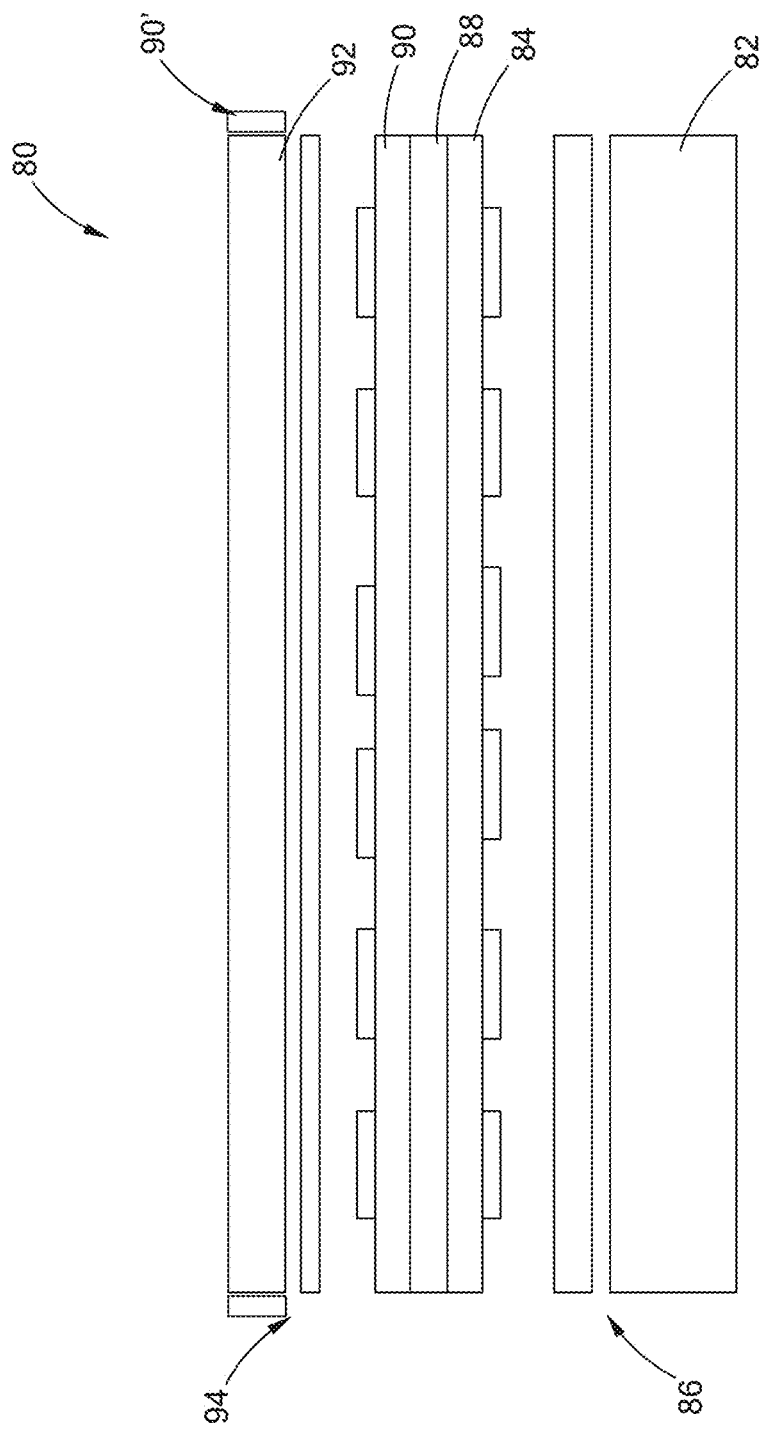
FIG. 3 is an exploded side view of another form of the heater of FIG. 1 having a tuning layer or tuning heater and constructed in accordance with the principles of the present disclosure.
Figure 4:
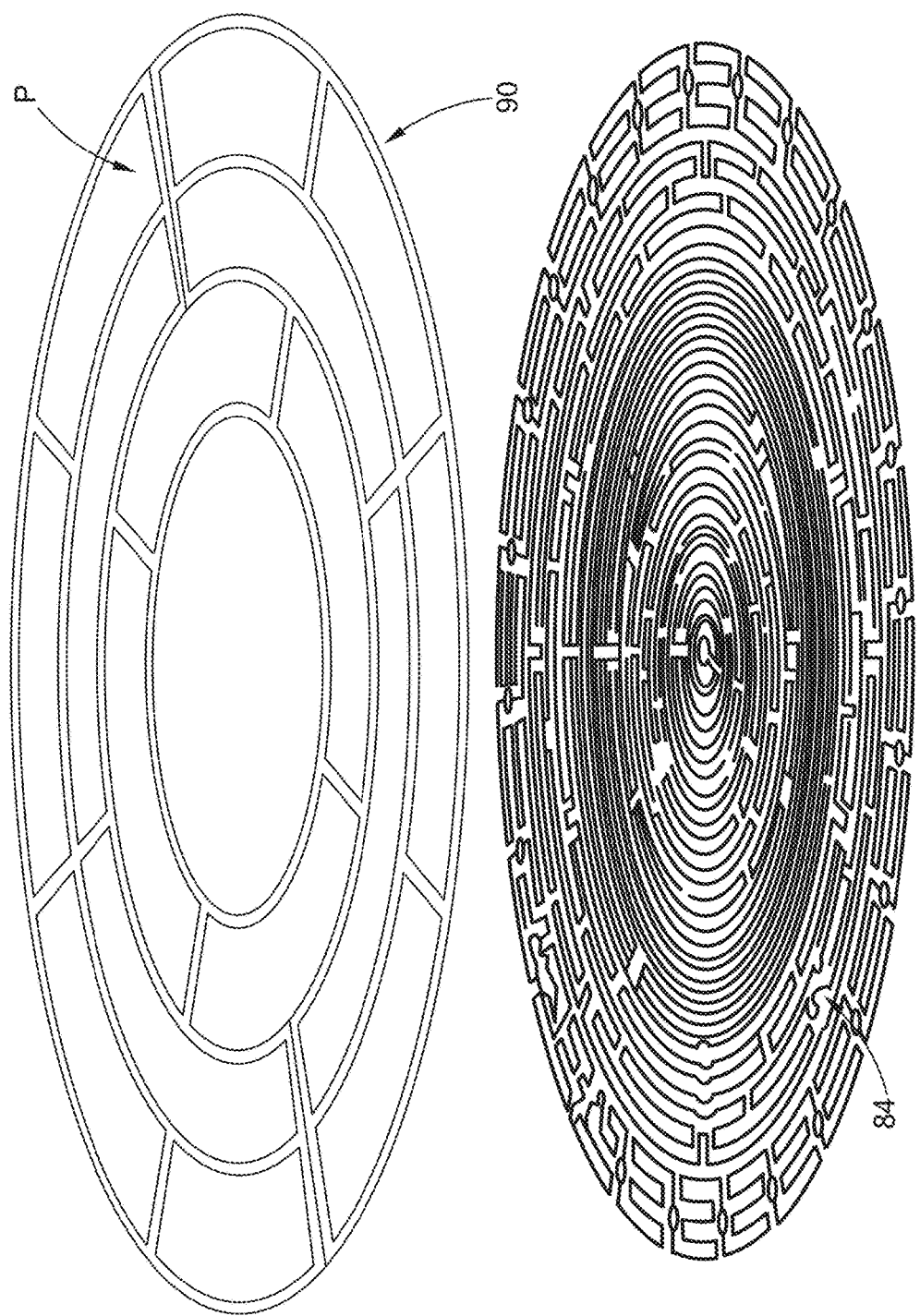
FIG. 4 is a perspective exploded view of the heater of FIG. 3, illustrating an exemplary four (4) zones for the base heater and eighteen (18) zones for the tuning heater in accordance with the principles of the present disclosure.
Figure 5:
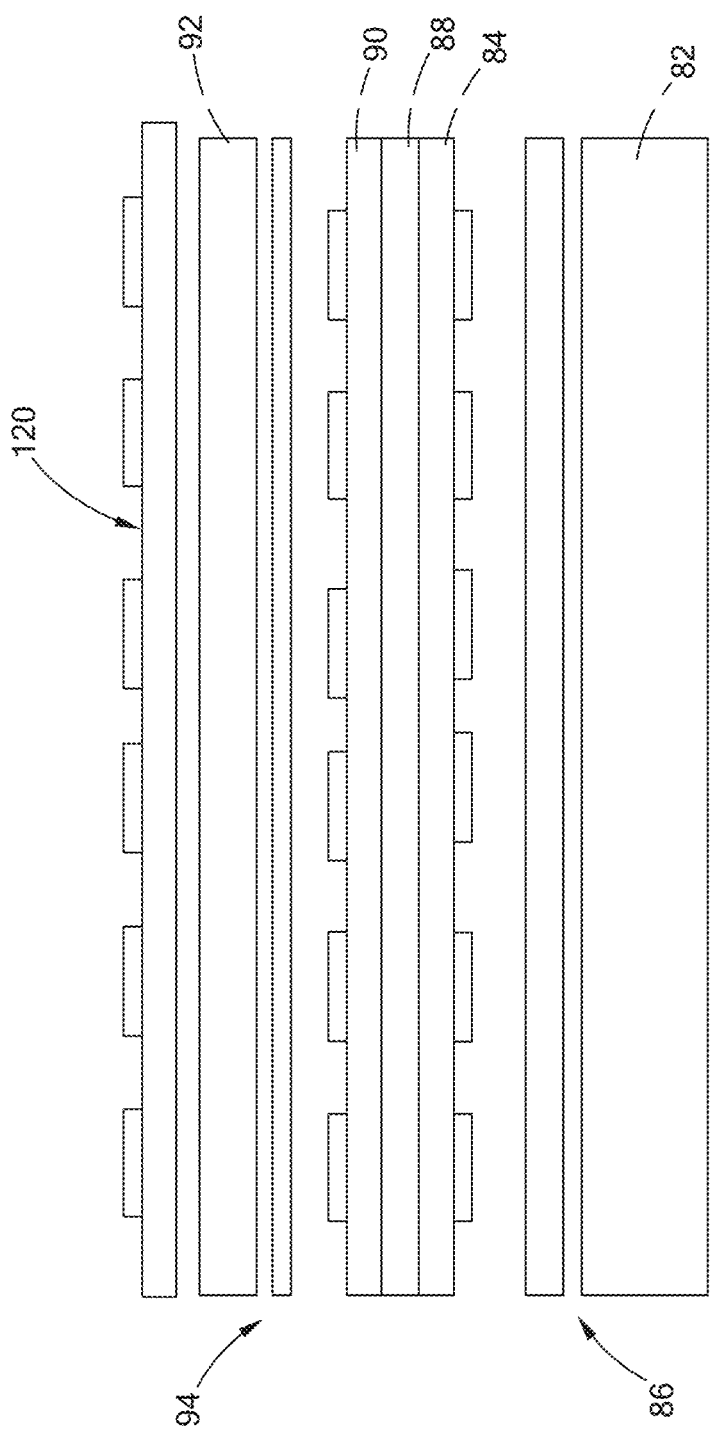
FIG. 5 is a side view of another form of a high definition heater system having a supplemental tuning layer and constructed in accordance with the principles of the present disclosure.

Referring now to FIGS. 3-5, one exemplary form of the heater having both a base heater layer and a tuning layer (as generally set forth above in FIG. 2) is illustrated and generally indicated by reference numeral 80. The heater 80 includes a base plate 82, (also referred to as a cooling plate), which in one form is an Aluminum plate approximately 16 mm in thickness. A base heater 84 is secured to the base plate 82, in one form using an elastomeric bond layer 86 as shown. The elastomeric bond may be one disclosed in U.S. Pat. No. 6,073,577, which is incorporated herein by reference in its entirety. A substrate 88 is disposed on top of the base heater 84 and is an Aluminum material approximately 1 mm in thickness according to one form of the present disclosure. The substrate 88 is designed to have a thermal conductivity to dissipate a requisite amount of power from the base heater 84. Because the base heater 84 has relatively high power, without a requisite amount of thermal conductivity, this base heater 84 would leave "witness" marks (from the resistive circuit trace) on adjacent components, thereby reducing the performance of the overall heater system.

A tuning heater 90 is disposed on top of the substrate 88 and is secured to a chuck 92 using an elastomeric bond layer 94, as set forth above. The chuck 92 in one form is an Aluminum Oxide material having a thickness of approximately 2.5 mm. It should be understood that the materials and dimensions as set forth herein are merely exemplary and thus the present disclosure is not limited to the specific forms as set forth herein. Additionally, the tuning heater 90 has lower power than the base heater 84, and as set forth above, the substrate 88 functions to dissipate power from the base heater 84 such that "witness" marks do not form on the tuning heater 90.

The base heater 84 and the tuning heater 90 are shown in greater detail in FIG. 4, in which an exemplary four (4) zones are shown for the base heater 84, and eighteen (18) zones for the tuning heater 90. In one form, the heater 80 is adapted for use with chuck sizes of 450 mm, however, the heater 80 may be employed with larger or smaller chuck sizes due to its ability to highly tailor the heat distribution. Additionally, the high definition heater 80 may be employed around a periphery (shown by area P) of the chuck (across a horizontal plane), or along a vertical location, FIG. 3, tuning layer 90', or in discrete predetermined locations across or along the chuck, or around the periphery other components or combinations of components, rather than in a stacked/planar configuration as illustrated herein. Further still, the high definition heater 80 may be employed in process kits, chamber walls, lids, gas lines, and showerheads, among other components within semiconductor processing equipment. It should also be understood that the heaters and control systems illustrated and described herein may be employed in any number of applications, and thus the exemplary semiconductor heater chuck application should not be construed as limiting the scope of the present disclosure.

The present disclosure also contemplates that the base heater 84 and the tuning heater 90 not be limited to a heating function. It should be understood that one or more of these members, referred to as a "base functional layer" and a "tuning layer," respectively, may alternately be a temperature sensor layer or other functional member while remaining within the scope of the present disclosure. Other functions may include, by way of example, a cooling layer or a diagnostic layer that would collect sensor input such as various electrical characteristics, among others.

As shown in FIG. 5, a dual tuning capability may be provided with the inclusion of a secondary tuning layer heater 120 on the top surface of the chuck 12. The secondary tuning layer may alternately be used as a temperature sensing layer rather than a heating layer while remaining within the scope of the present disclosure. Accordingly, any number of tuning layer heaters may be employed and should not be limited to those illustrated and described herein.

In another form, the base functional layer may include a plurality of thermoelectric elements rather than the base heater 84 construction as set forth above. These thermoelectric elements may also be arranged in zones and are generally disposed on top of, or proximate, the base plate or cooling plate 82.

Figure 6:
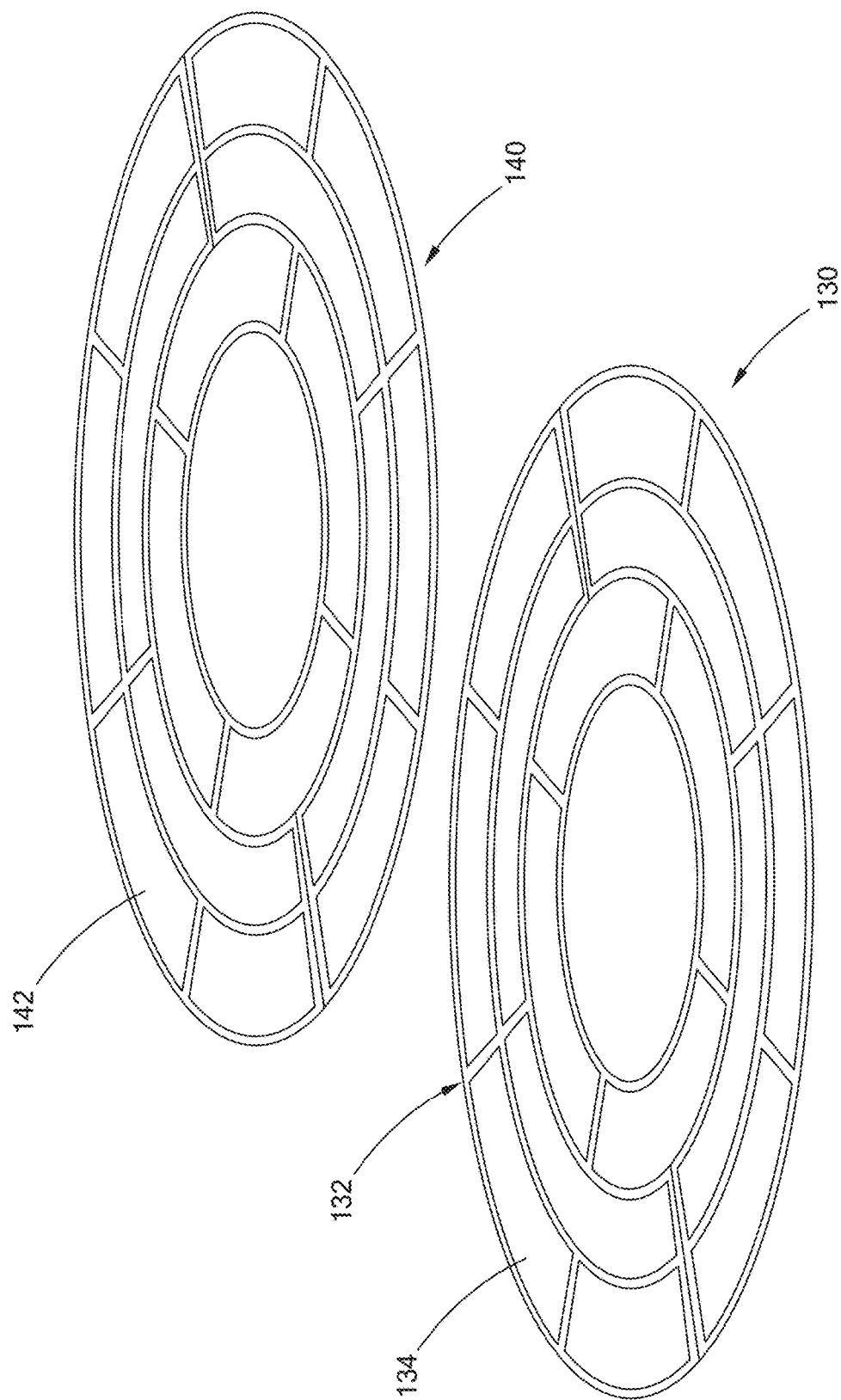
FIG. 6 is an exploded perspective view of alternating tuning layers that are offset from one another in accordance with another form of the present disclosure.

In still another form, the multiple tuning layers may be employed in a "stacked" configuration, or configured vertically such that individual resistive traces are offset from adjacent resistive traces on opposed layers to compensate for the gaps that exist between traces. For example, as shown in FIG. 6, a first tuning layer 130 is offset from a second tuning layer 140 such that the traces 142 of tuning layer 140 are aligned adjacent the gaps 132 between the traces 134 of the first tuning layer 130, and vice versa. In another form, a "checkerboard" design may be employed in order to compensate for gaps or hot spots between adjacent layers.

Figure 7:
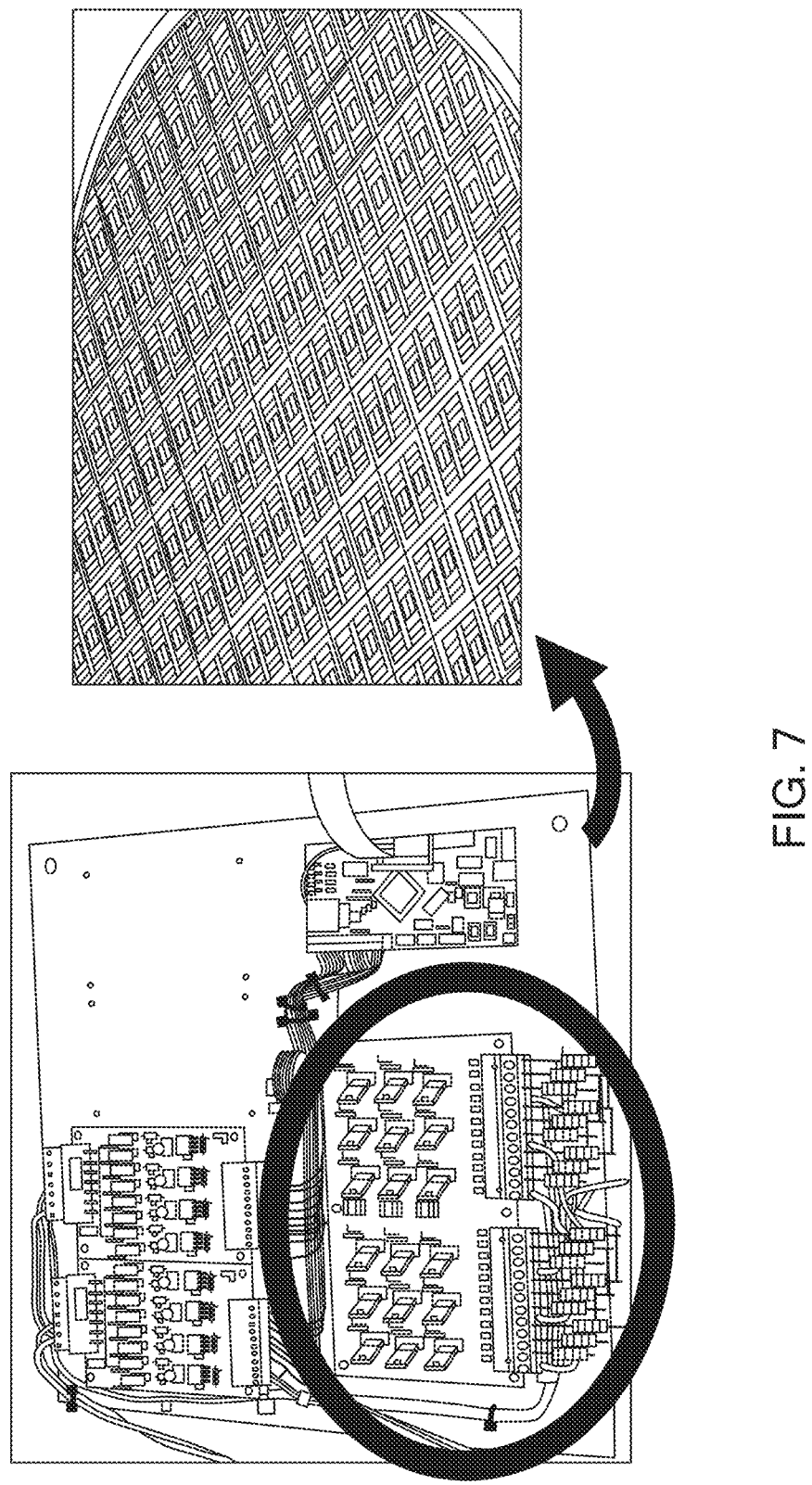
FIG. 7 is a perspective view of control devices that are embedded into layers of the heater chuck assembly in accordance with one form of the present disclosure.
Figure 8:
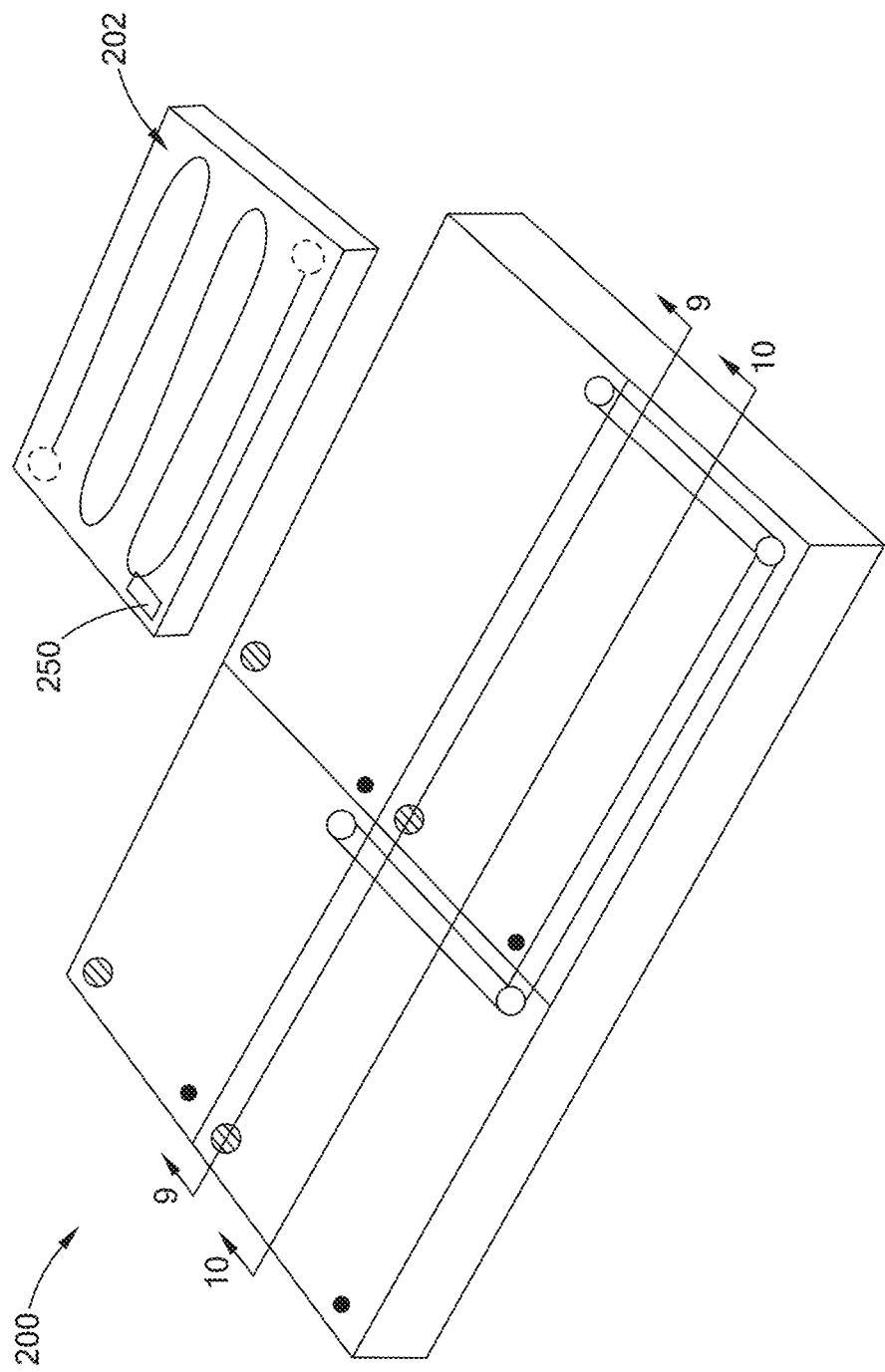
FIG. 8 is a perspective view of a heater system having independently controllable heater elements constructed in accordance with the principles of the present disclosure.
Figure 9:
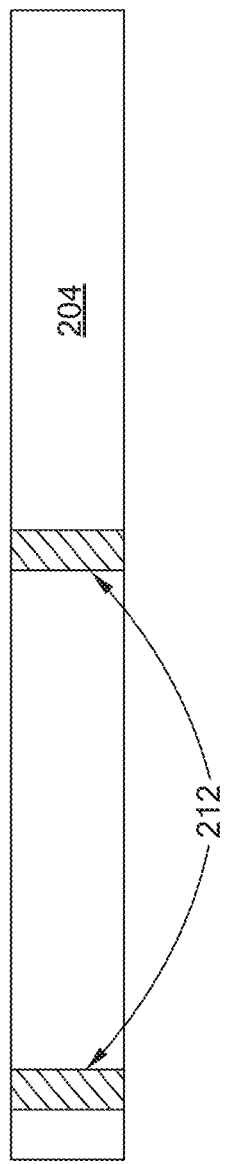
FIG. 9 is a cross-sectional view, taken along line 9-9 of FIG. 8, illustrating vias of the heater system and constructed in accordance with the principles of the present disclosure.
Figure 10:
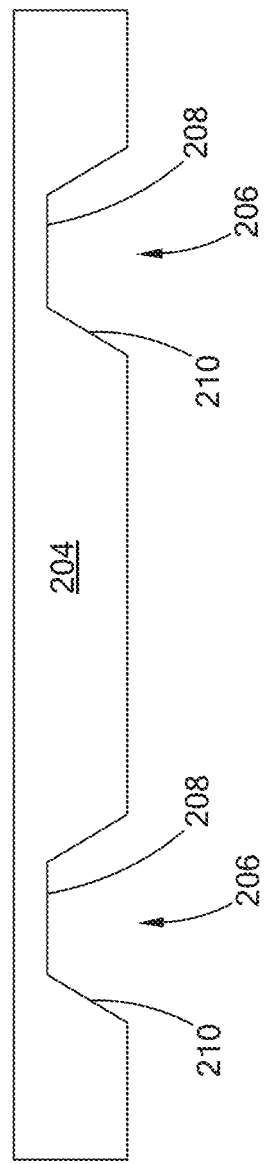
FIG. 10 is a partial cross-sectional view, taken along line 10-10 of FIG. 8, illustrating an upper base of the heater system and constructed in accordance with the principles of the present disclosure.
Figure 11:
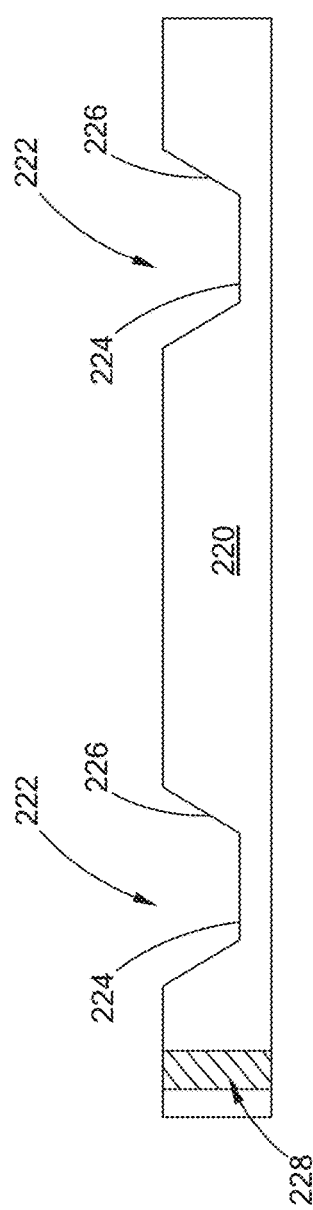
FIG. 11 is a partial cross-sectional view, taken along line 11-11 of FIG. 8, illustrating a lower base of the heater system and constructed in accordance with the principles of the present disclosure.
Figure 12:
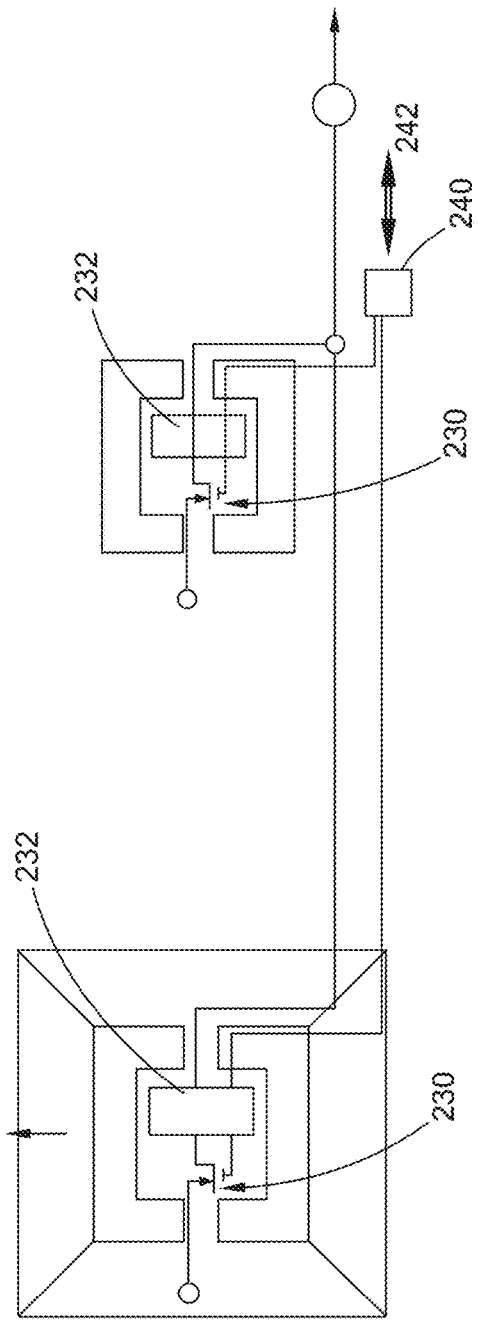
FIG. 12 is a top view of FIG. 11, illustrating elements within tapered cavities of the lower base and constructed in accordance with the principles of the present disclosure.

Referring to FIG. 7, the threshold voltage switching circuits, which in one form comprise discrete solid state devices that electrically conduct in one direction when the voltage threshold across the circuit is exceeded and which, are embedded into or attached to the body of the heater chuck, which may be in a packaged form or generally embedded as bare die components. In another form, the control elements are embedded in the bond layer 86 as illustrated above. It should be understood that the control elements may be embedded within any of the components or assemblies thereof while remaining within the scope of the present disclosure. Alternately, the threshold voltage switching circuits on a single package silicon controls device (ASIC) may be embedded into or attached to the chuck in one form of the present disclosure. Additional controls devices may also be employed in order to provide redundancy should any of the components fail during operation.

One exemplary form of embedding controls is illustrated in FIGS. 8-12. As shown, this alternate form of a heater system is illustrated and generally indicated by reference numeral 200. The heater system 200 comprises a plurality of independently controllable heater elements 202, the operation of which is set forth in greater detail below, in order to provide a highly tailored temperature profile to a heating target, such as a uniform temperature profile to a substrate in semiconductor processing as set forth above. An upper base 204 is disposed proximate the heater elements 202, and in one form, the heater elements 202 are disposed on the upper base 204, such as an etched foil bonded to or a layered heater deposited onto the upper base 204. The upper base 204 defines a plurality of tapered cavities 206, which are aligned with each of the heater elements. The tapered cavities 206 in this form include an upper wall 208 and tapered side walls 210 as shown. The upper base 204 further comprises a plurality of power vias 212 in order to provide a passageway for power and control lines, as set forth below.

A lower base 220 is adjacent the upper base 204 and defines a plurality of reverse tapered cavities 222 aligned with the tapered cavities 206 of the upper base 204. The reverse tapered cavities 222 similarly define a lower wall 224 and tapered sidewalls 226. The lower base 220 further comprises a plurality of power vias 228 in communication with the power vias 212 of the upper base 204, which also serve as passageways for power and control lines.

Figure 1:
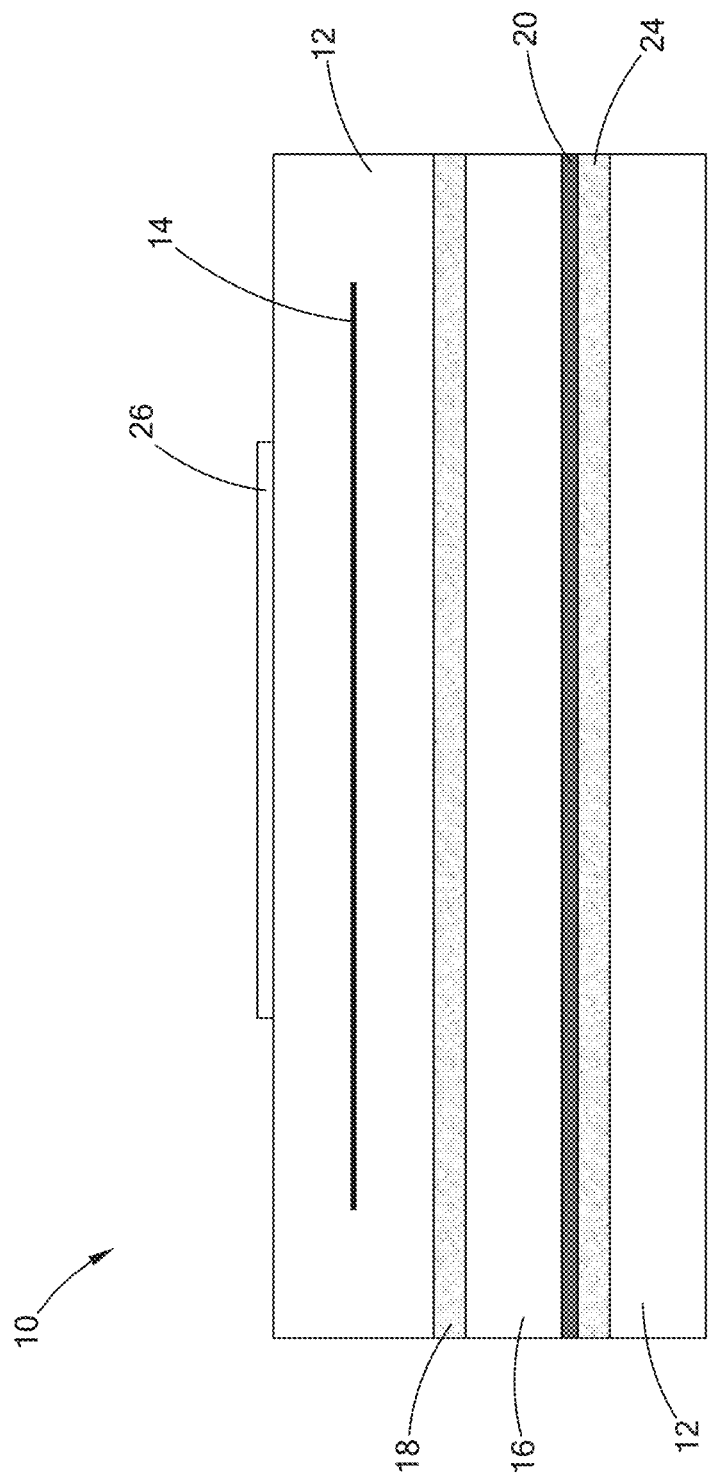
FIG. 1 is an elevated side view of a prior art electrostatic chuck.
Figure 14:
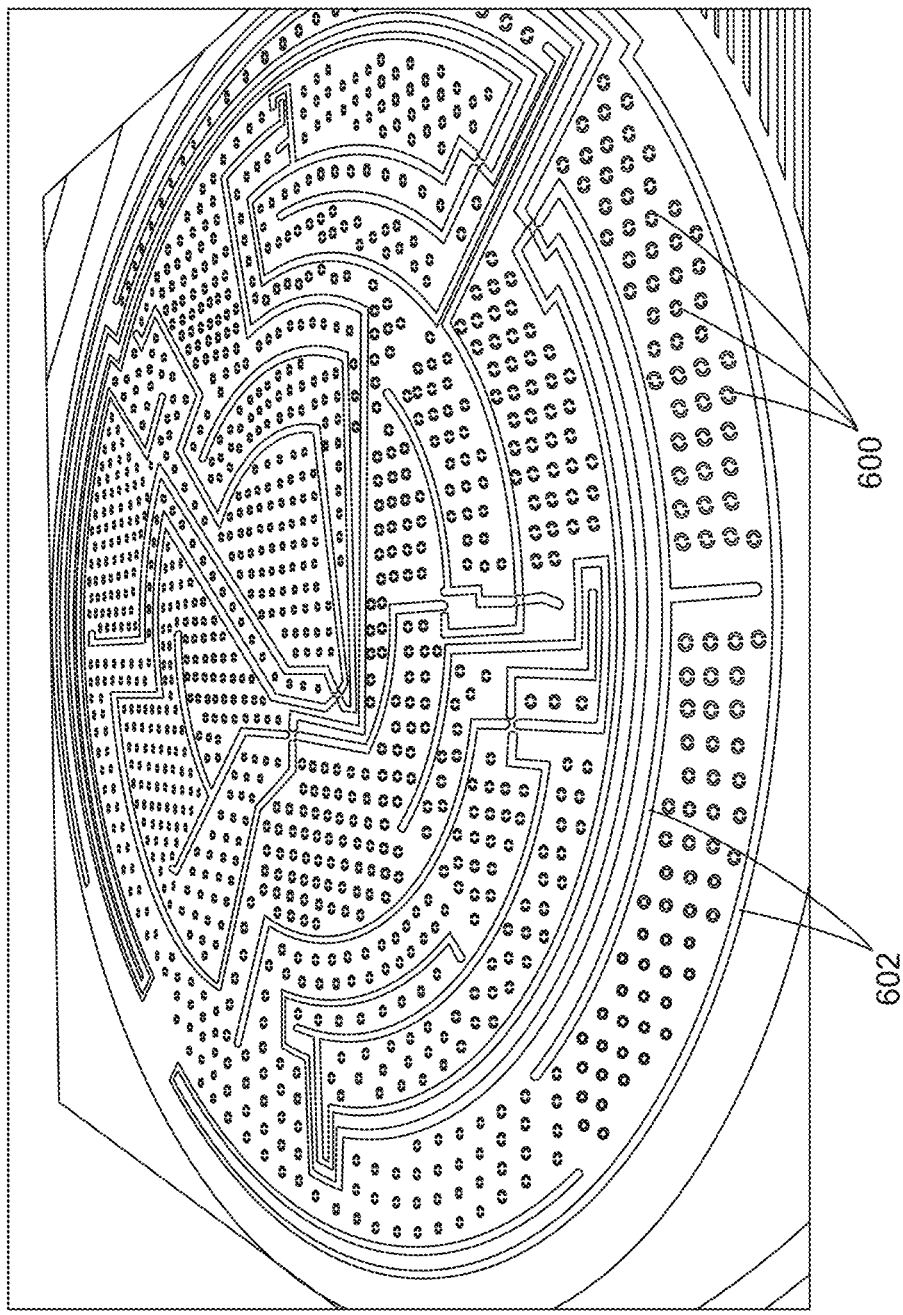
FIG. 14 is a perspective view illustrated a plurality of support elements constructed in accordance with another form of the present disclosure.

As best shown in FIG. 14, the shape of the cavities 206, 222 are configured to provide for an efficient transfer of heat from the heater elements 202 to a cooling plate (shown as element 22 in FIG. 1) and also to reduce the thermal impact of the cavities and their components on the performance and temperature profile provided by the heater elements 202. Accordingly, the "footprint" of the cavity is smaller near the heater elements 202, and the cavity gradually increases in size to direct the heat flux around the cavity 206, and then gradually decreases in size to direct the heat flux around the cavity 222 towards the cooling plate 22. It should be understood that other geometries for the cavities 206 and 222 may be provided by the present disclosure, and thus the tapered configurations should not be construed as limiting the scope of the present disclosure.

As further shown, a plurality of pairs of switching elements 230 and control elements 232 are disposed within the reverse tapered cavities 222 of the lower base 220 and in communication with the plurality of heater elements 202. Generally, the switching elements 230 and control elements 232 control operation of the heater elements 202 in order to provide a requisite temperature profile, and in one application, a uniform temperature profile to the substrate in semiconductor processing equipment as set forth above. More specifically, and in one form, the control element is a microprocessor. In another form, the control element is a circuit in accordance with the raster boost heater as set forth above. In one form, the control elements 232 communicate across a digital bus 234 for temperature control of the heater elements 202.

The heater system 200 further comprises a multiplexer 240 in communication with each of the control elements 232, which sends the appropriate control signals to each of the heater elements 202 for a desired temperature profile. In one form, the multiplexer 240 communicates with a power supply (not shown) through an optical bus 242.

Additionally, the heater system 200 may also include a plurality of discrete temperature sensors 250 disposed proximate the plurality of heater elements 202. In an alternate form, the heater elements 202 comprise a resistive material having sufficient temperature coefficient of resistance characteristics such that the resistive material functions as both a heater and a temperature sensor, as set forth herein in other forms of the present disclosure.

In an electrostatic chuck application, the heater system 200 further comprises an RF filter 260, which in one form is in communication with a digital bus 262.

Temperature calibration of any of the systems set forth herein may be performed by first measuring the individual resistances of the tuning layer heaters using a standard resistance meter. In another method, alone or in addition to the method above, the tuning layer heater elements 62 may be held at a constant temperature and pulsed as in normal operation but for short duration only, and then the resistance is calculated and set into the control system. An iterative technique of this at the same or multiple temperature points will calibrate the system for control.

Figure 13:
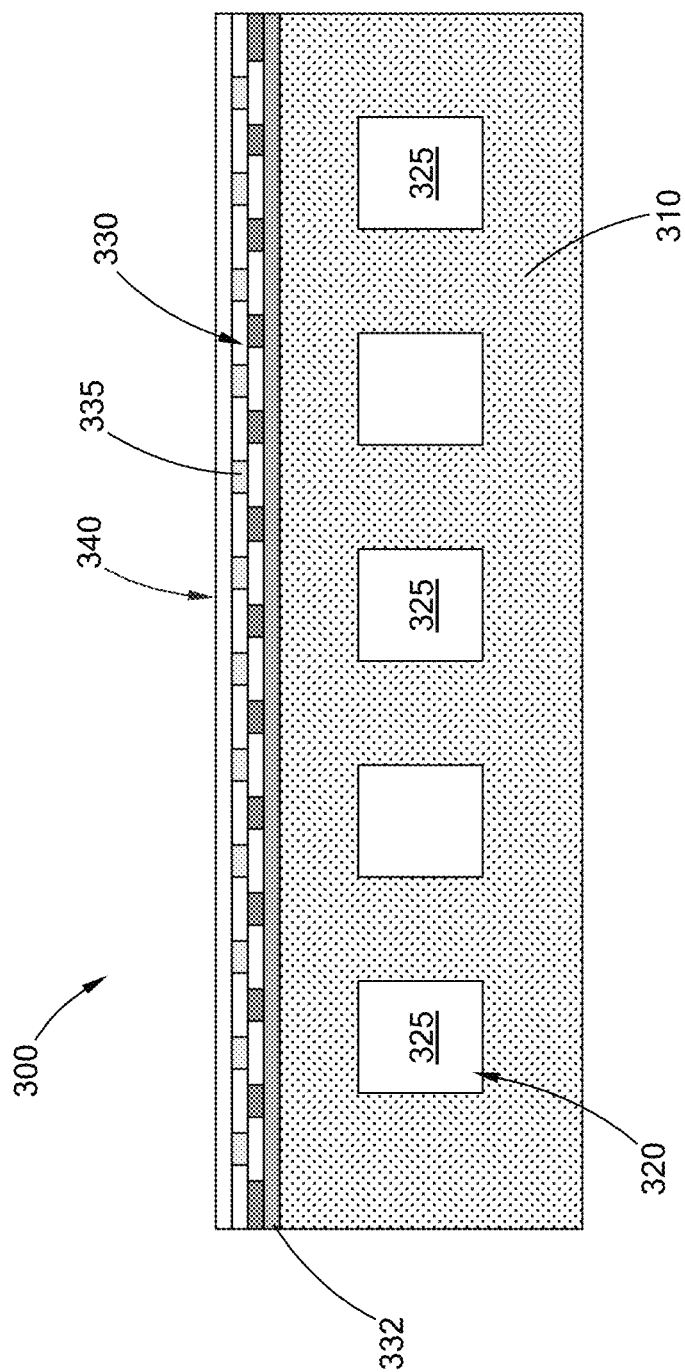
FIG. 13 is a cross-sectional view of another form of a high definition heater system with the base member having fluid passageways for a two-phase fluid and constructed in accordance with the teachings of the present disclosure.

Referring now to FIG. 13, another form of a heater system is illustrated and generally indicated by an apparatus 300. The apparatus 300, which is a heater in one form of the present disclosure, includes a base member 310 having at least one fluid passageway 320. Multiple fluid passageways 320 are illustrated in this form, and the passageways 320 may further define zones (such as the heater zones as set forth above) in another form of the present disclosure. A two-phase fluid 325 is disposed within the fluid passageways 320, and a pressure of the two-phase fluid 325 is controlled such that the two-phase fluid 325 provides heating to the base member 310. This system is described in greater detail, for example, in U.S. Pat. Nos. 7,178,353 and 7,415,835 and also in published U.S. application No. 20100076611, the contents of which are incorporated herein by reference in their entirety. Generally, in these systems, pressurized refrigerant is provided as a condensed liquid and also in a gaseous state. The condensed liquid is expanded to a vaporous mix, and the gaseous refrigerant is added to reach a target temperature determined by its pressure. Temperature corrections can thus be made very rapidly by gas pressure adjustments. Such systems are provided by Advanced Thermal Sciences Corporation and may be employed with the teachings of the present disclosure.

As further shown, a tuning layer 330 is secured to the base member 310, for example with an adhesive layer 332, wherein the tuning layer 330 comprising a plurality of zones 335. This tuning layer 330 is similar to the tuning layers and heaters set forth above, and as such, will not be described again in detail for purposes of clarity. Similar to the forms set forth above, the tuning layer 335 has lower power than the base member 310. And as further shown, a component 340, such as by way of example, a chuck, a pedestal, a wafer table, a substrate support, or a showerhead, is secured to the tuning layer 330. As used herein, a "component" should be construed to mean any member or assembly on which a wafer is supported, either directly or indirectly, for processing.

In one form, the tuning layer 330 is a heater, and yet in another form, the tuning layer 330 is a temperature sensor, as set forth in detail above. This tuning layer 330, and also the base member 310, may be designed with a material having sufficient TCR characteristics such that they function as both a heater and as a temperature sensor. Additionally, a secondary tuning layer (shown in FIG. 5) is secured to a top surface of the component 340, and it should also be understood that any number of tuning layers, functioning as heaters and/or temperature sensors, may be employed while remaining within the scope of the present disclosure. With the secondary tuning layer secured to the top surface of the component 340, the wafer would be supported indirectly, versus directly when the wafer is on the top surface of the component 340.

The apparatus 300 may also employ the routing layer 66 as shown in FIG. 2 in order to accommodate a number of power lines. Additional features as set forth herein throughout the figures may also be employed with this form of the present disclosure having a base member 310 with fluid passageways 320 while remaining within the scope of the present disclosure.

Figure 15:
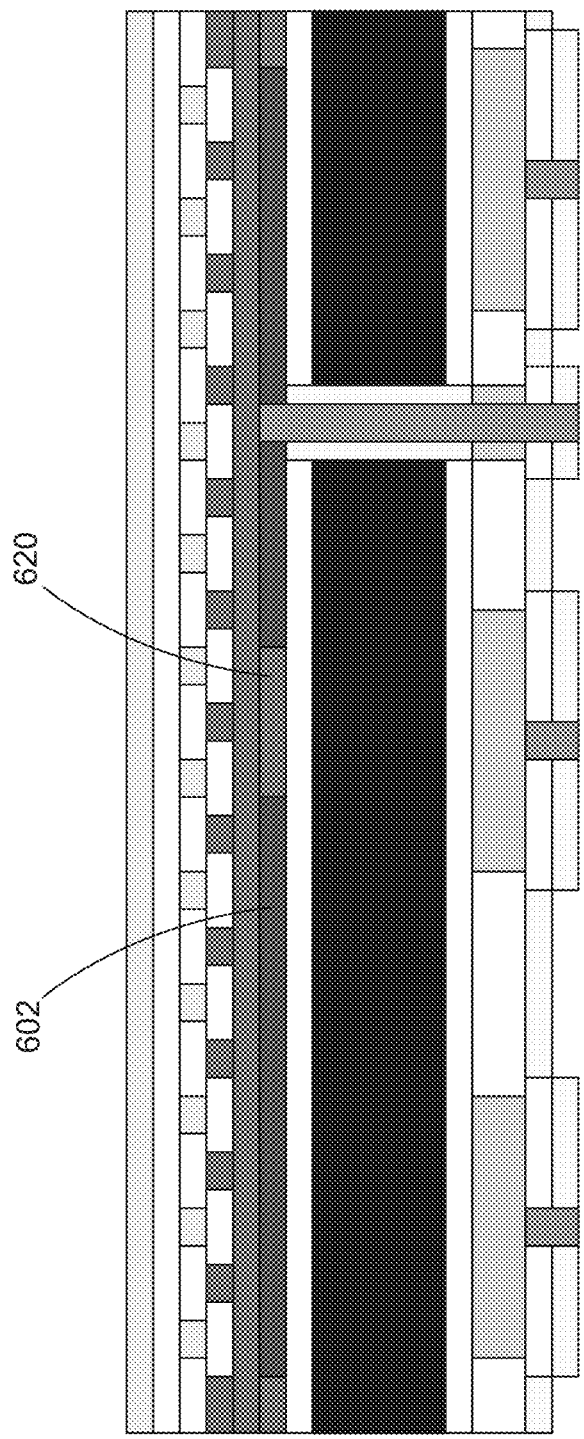
FIG. 15 is a cross-sectional view illustrating the support elements in accordance with the teachings of the present disclosure.
Figure 16:
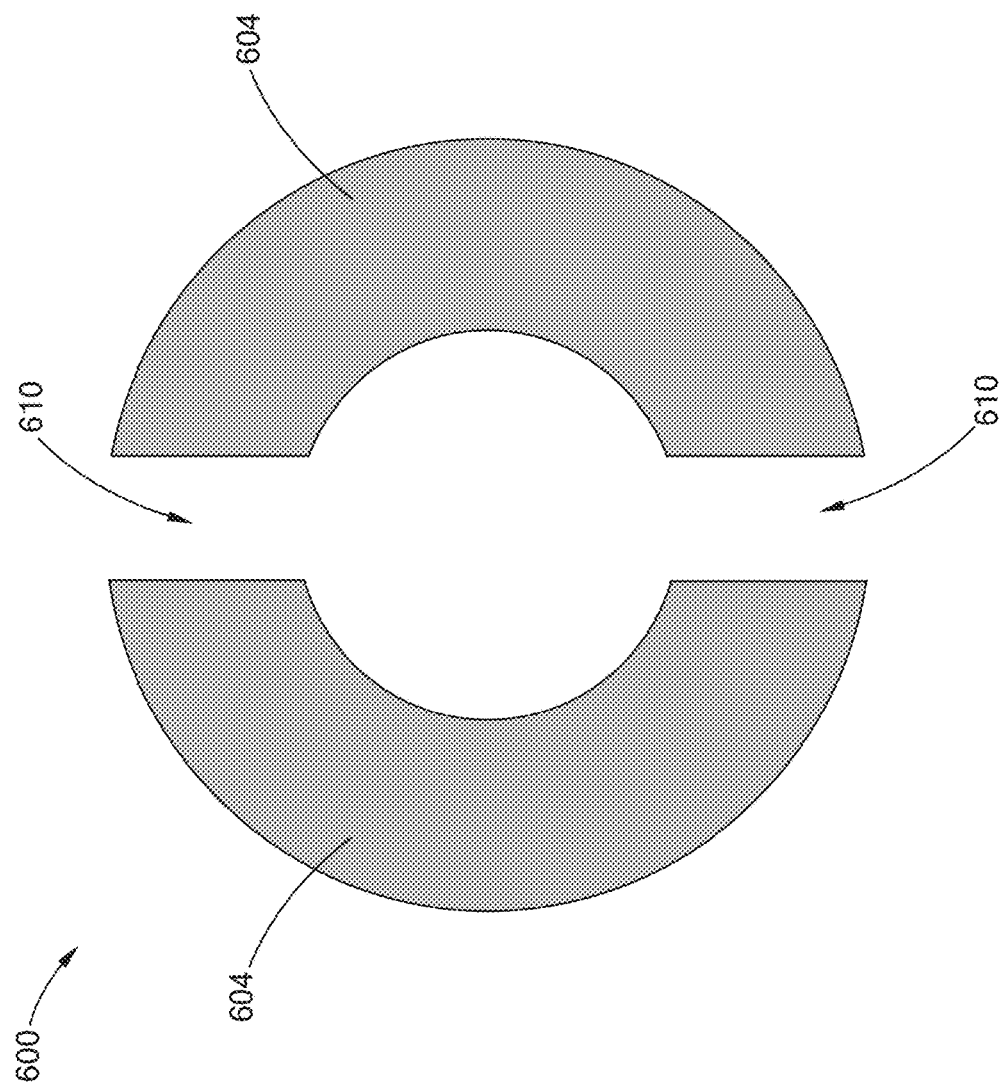
FIG. 16 is an enlarged plan view of a support element in accordance with the teachings of the present disclosure.

Referring now to FIGS. 14-16, another form of the present disclosure includes a plurality of support elements 600 are provided between the tuning heater layer and the boost heater layer in order to provide the requisite flatness during manufacture, which in this form is a press process. More specifically, in this form of the present disclosure, the support elements 600 are etched into a copper layer 602 having a heater circuit. As shown in FIG. 14, relatively large space is present between traces in the copper layer 602, which is somewhat of a void that contributes to a non-flat laminate, or a laminate that has an undesirable flatness. By providing support elements 600, additional structure is provided in order to improve flatness. And as shown in FIG. 16, the support elements 600 are in a "split" configuration, or are comprised of two portions 602 and 604 having an opening 610 therebetween. As such, the adhesive 620 (shown in FIG. 15) is allowed to flow more evenly between each of the support elements 600.

Figure 17:
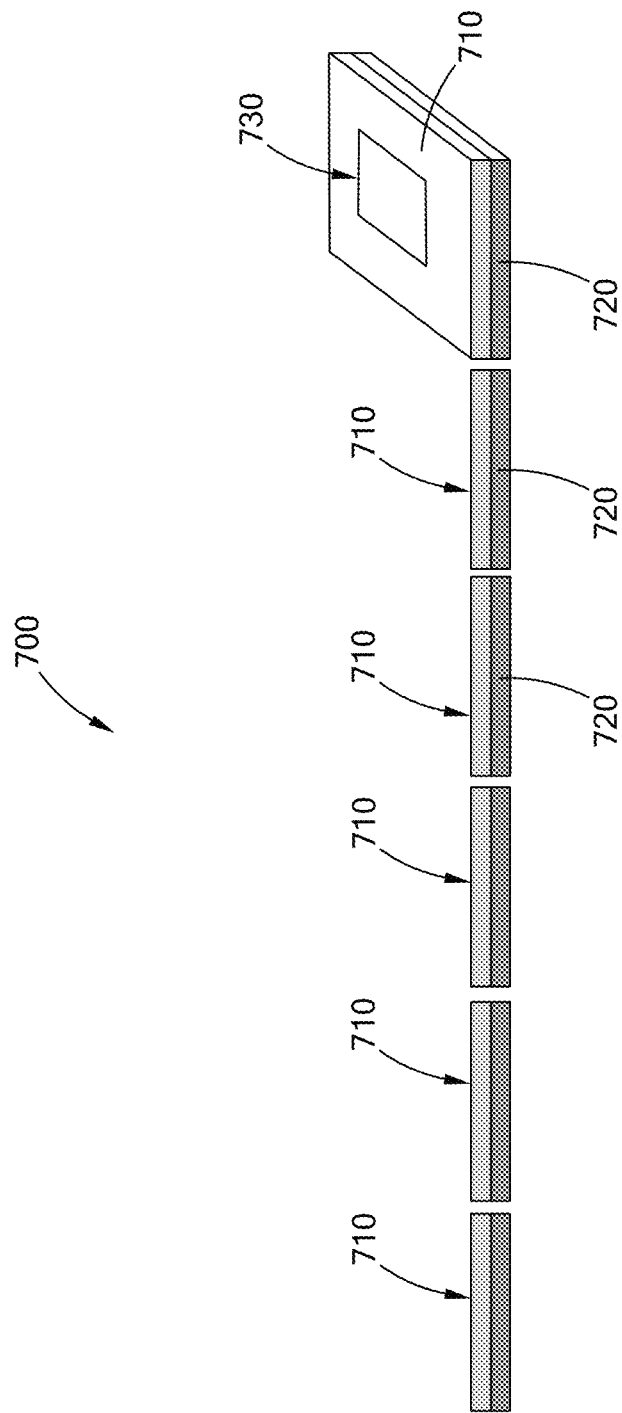
FIG. 17 is a perspective view illustrating heat spreaders constructed in accordance with the teachings of the present disclosure.

As shown in FIG. 17, another form of the tuning heater 700 is illustrated, wherein a corresponding plurality of heat spreaders 710 are disposed on each of the elements 720 to provide temperature uniformity across the individual elements 720. The heat spreaders can be a variety of materials, including but not limited to, Aluminum, Copper, and Pyrolytic Graphite, including PGS (Pyrolytic Graphite Sheet). In one form, the heat spreaders 710 are a monolithic and constant thickness configuration as shown. However, it should be understood that other configurations, including integral grooves, or heat guides, 730 may also be provided while remaining within the scope of the present disclosure.

Each of the tuning layers/heaters set forth herein are controlled by a control system, various forms of which are set forth in greater detail in co-pending applications titled "System and Method for Controlling a Thermal Array," and applications titled "Thermal Array System," concurrently filed herewith and commonly assigned with the present application. Generally, the control systems have a plurality of sets of power lines in communication with the tuning layer and a plurality of addressable control elements in electrical communication with the power lines and with the tuning layer, the control elements providing selective control of the tuning layer zones. The control elements may be, by way of example, threshold voltage switching circuits, which may be semiconductor switches. The threshold voltage switching circuits may be packaged, for example in an ASIC (Application Specific Integrated Circuit). Furthermore, the control elements may be embedded within the component, such as the chuck, as set forth above. These control systems and their related algorithms are described and illustrated in greater detail in the co-pending applications set forth above and thus are not included herein for purposes of clarity.

It should be noted that the disclosure is not limited to the embodiments described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A thermal system comprising:
a base member comprising at least one fluid passageway in which a two-phase fluid is disposed, a pressure of the two-phase fluid being controlled such that the two-phase fluid provides at least one of heating and cooling to the base member;
a tuning layer secured to the base member and comprising a plurality of zones;
an upper member disposed on the tuning layer, a lower member disposed on the upper member, wherein the upper member and the lower member define a plurality of cavities;
a cooling plate disposed on the lower member;
a power supply;
and
a control system including:
a plurality of sets of power lines in communication with the tuning layer and the power supply; and
a plurality of addressable control elements disposed within the plurality of cavities and in electrical communication with the tuning layer and the power supply through the plurality of sets of power lines, the plurality of addressable control elements providing selective control of the plurality of zones of the tuning layer.

2. The thermal system according to claim 1, further comprising a component disposed on the tuning layer, wherein the control elements provide selective control of the plurality of zones of the tuning layer to selectively generate different amount of heat in the plurality of zones depending on a desired heat distribution on the component and an actual heat distribution provided by the base member to the component to fine tune the actual heat distribution provided by the base member to the component.

3. The thermal system according to claim 2, wherein the tuning layer is a tuning heater that provides less heat transfer to the component disposed on the tuning heater than the base member provides to the component such that the base member provides a primary heating to the component and the tuning heater provides a secondary heating to the component.

4. The thermal system according to claim 1, wherein the control elements are threshold voltage switching circuits.

5. The thermal system according to claim 1, wherein the threshold voltage switching circuits comprise semiconductor switches.

6. The thermal system according to claim 5, wherein the threshold voltage switching circuits are packaged switching circuits.

7. The thermal system according to claim 6, wherein the packaged switching circuits are ASICs (Application Specific Integrated Circuits).

8. The thermal system according to claim 1, wherein the upper member defines a plurality of upper cavities and a lower member defines a plurality of reverse cavities, and the plurality of upper cavities and the plurality of reverse cavities aligned with each other to form the plurality of cavities.

9. The thermal system according to claim 8, wherein each of the plurality of upper cavities comprise an upper wall and tapered sidewalls extending from the upper wall, and each of the plurality of reverse cavities comprise a lower wall and tapered sidewalls extending from the lower wall.

10. The thermal system according to claim 9, further comprising a plurality of pairs of switching elements and control elements disposed within the plurality of reverse tapered cavities of the lower member.

11. The thermal system according to claim 10, further comprising a multiplexer in communication with each of the control elements, wherein the multiplexer sends signals to each of a plurality of heater elements of the tuning layer to achieve a desired temperature profile.

12. The thermal system according to claim 11, wherein the multiplexer communicates with a power supply through an optical bus.

13. The thermal system according to claim 9, wherein the plurality of cavities are aligned with the plurality of zones and the plurality of addressable control elements are disposed within the plurality of reverse cavities of the lower member.

14. The thermal system according to claim 1, further comprising a plurality of switching elements disposed in the plurality of plurality of cavities.

15. The thermal system according to claim 1, wherein the control elements communicate across a digital bus.

16. The thermal system according to claim 1, wherein the upper member and the lower member each include a plurality of power vias, the plurality of power vias of the upper member being in communication with the plurality of power vias of the lower member.

17. A thermal system comprising:
   a base member comprising at least one fluid passageway in which a two-phase fluid is disposed, a pressure of the two-phase fluid being controlled such that the two-phase fluid provides at least one of heating and cooling to the base member;
   a tuning layer secured to the base member and defining a plurality of zones;
   an upper member disposed proximate the tuning layer and defining a plurality of upper tapered cavities aligned with each of the zones, the upper member further comprising a plurality of power vias;
   a lower member disposed adjacent the upper member and defining a plurality of reverse tapered cavities aligned with the plurality of upper tapered cavities of the upper member and defining a plurality of cavities, the lower member further comprising a plurality of power vias in communication with the power vias of the upper member;
   a power supply; and
   a control system including:
      a plurality of sets of power lines in communication with the tuning layer and the power supply; and
      a plurality of addressable control elements disposed in the plurality of tapered cavities of the lower members and being in electrical communication with the tuning layer and the power supply disposed outside the tapered cavities through the plurality of sets of power lines, the control elements providing selective control of the tuning layer zones.

18. The thermal system according to claim 17 further comprising a cooling plate disposed on the lower member, wherein the plurality of tapered cavities direct a heat flux from the tuning layer around the plurality of addressable control elements disposed in the plurality of tapered cavities to the cooling plate.

* * * * *